United States Patent
Hatanaka et al.

(10) Patent No.: US 7,763,115 B2
(45) Date of Patent: Jul. 27, 2010

(54) VACUUM FILM-FORMING APPARATUS

(75) Inventors: Masanobu Hatanaka, Shizuoka-ken (JP); Michio Ishikawa, Shizuoka-ken (JP); Se-Ju Lim, Shizuoka-ken (JP); Fumio Nakamura, Shizuoka-ken (JP)

(73) Assignee: ULVAC, Inc., Kanagawa (JP)

( * ) Notice: Subject to any disclaimer, the term of this patent is extended or adjusted under 35 U.S.C. 154(b) by 810 days.

(21) Appl. No.: 11/133,437

(22) Filed: May 20, 2005

(65) Prior Publication Data

US 2005/0268852 A1 Dec. 8, 2005

(30) Foreign Application Priority Data

May 21, 2004 (JP) ............................. 2004-151615
Apr. 28, 2005 (JP) ............................. 2005-130851

(51) Int. Cl.
*C23C 16/00* (2006.01)
*C23F 1/00* (2006.01)
*H01L 21/306* (2006.01)

(52) U.S. Cl. ............. 118/719; 156/345.31; 156/345.32; 414/939

(58) Field of Classification Search ................. 118/719; 156/345.31, 345.32; 414/939
See application file for complete search history.

(56) References Cited

U.S. PATENT DOCUMENTS 5,667,592 A * 9/1997 Boitnott et al. ............. 118/719
6,203,619 B1 * 3/2001 McMillan ................... 118/719
7,025,831 B1 * 4/2006 Butterbaugh et al. ........ 118/724
2002/0122885 A1 * 9/2002 Ahn ....................... 427/255.28
2002/0164420 A1 * 11/2002 Derderian et al. ......... 427/248.1

FOREIGN PATENT DOCUMENTS

| JP | 2003-318174 | 11/2003 |
|---|---|---|
| JP | 2004-006856 | 1/2004 |

* cited by examiner

*Primary Examiner*—Karla Moore
(74) *Attorney, Agent, or Firm*—Arent Fox LLP (57) ABSTRACT

A vacuum film-forming apparatus comprising substrate stages; vacuum chamber-forming containers opposed to the stages; a means for moving the substrate between the stages; and gas-introduction means connected to every containers, wherein one of the stage and the container is ascended or descended towards the other to bring the upper face of the stage and the opening of the container into contact with one another so that vacuum chambers can be formed and that a raw gas and/or a reactant gas can be introduced into each space of the chamber through each gas-introduction means to carry out either the adsorption or reaction step for allowing the raw gas to react with the reactant gas. The apparatus permits the independent establishment of process conditions for the adsorption and reaction processes and the better acceleration of the reaction between raw and reactant gases to give a film having excellent quality and the apparatus can be manufactured at a low cost.

9 Claims, 6 Drawing Sheets

VACUUM FILM-FORMING APPARATUS

BACKGROUND OF THE INVENTION

1. Field of the Invention

The present invention relates to a vacuum film-forming apparatus or device, in particular, to a vacuum film-forming apparatus (an atomic layer deposition apparatus), which forms a thin film according to the ALD technique (Atomic Layer Deposition Technique).

2. Description of the Prior Art

Recently, the patterns of semiconductor integrated circuits have increasingly been finer and it has correspondingly been devised that fine contact holes, trenches and other similar structures having high aspect ratios have been filled up with a distributing wire material such as Cu and/or Al. If the aspect ratio increases in this manner, it would be difficult to fill up such holes and/or trenches with a conductive film in a good or high coverage.

When using, for instance, Cu as a principal distributing wire material in the case of the foregoing embedded distributing wire structure, deposited Cu may easily diffuse into the neighboring insulating film and this becomes a cause of various defects and troubles. For this reason, a conductive barrier film is formed between an insulating film and such a conductive film to thus inhibit or control any possible diffusion of Cu. There have been proposed various methods for forming such a barrier film and there has been known, for instance, a method which comprises the step of forming a barrier film by depositing a layer of a material such as Ta, TiN, and/or TaN while using, for instance, the ALD technique (see, for instance, Japanese Un-Examined Patent Publication 2004-6856 (see, for instance, claims)).

The ALD technique is similar to the CVD technique in that it makes use of a chemical reaction between precursors. However, they differ from one another in that the usual CVD technique makes use of such a phenomenon that two kinds of gaseous precursors are brought into contact with one another to thus cause the reaction between them, while the ALD technique makes use of a surface reaction between two precursors. More specifically, the ALD technique comprises the steps of forming a desired metal film by supplying one of two precursors (for instance, a reactant gas) onto the surface of a substrate on which the other precursor (for instance, a raw gas) has been adsorbed to bring these precursors into contact with one another on the substrate surface and to thus cause a film-forming reaction between them. In this case, the precursor preliminarily adsorbed on the substrate surface undergoes the reaction with the precursor subsequently supplied to the surface at a quite high reaction rate on the substrate surface. In this respect, such precursors may be in the form of, for instance, solids, liquids or gases and the raw gas is supplied together with a carrier gas such as $N_2$ or Ar. As has been described above, the ALD technique is a film-forming method which comprises alternatively repeating a step of adsorbing a raw gas on a substrate surface and a step of allowing the adsorbed raw gas to react with a reactant gas to thus form a film in an atomic level. More specifically, these precursors always undergo such adsorption and reaction within a superficial moving region and accordingly, this technique would ensure the considerably high step-coverage characteristics. In addition, the raw gas is allowed to react with the reactant gas while separately supplying these gases and therefore, it can improve the film density. For this reason, this technique has attracted special interest recently.

A conventional atomic layer-depositing apparatus (ALD apparatus) in which a thin film is formed according to the foregoing ALD technique comprises a film-forming unit or chamber provided with an evacuation means and it further comprises a stage for supporting a substrate (hereunder referred to as "substrate stage"), which is equipped with a heating means and disposed within the film-forming chamber, and a gas-introduction means disposed on the side opposite to the substrate stage and arranged on the ceiling of the film-forming chamber. As such an ALD apparatus, there has been known, for instance, one which is so designed that a thin film having a desired thickness can be prepared by separately and periodically supplying a desired raw gas and a desired reactant gas into the apparatus through a gas-introduction means to thus repeat a raw gas-adsorption step and a plasma-assisted reaction step for allowing the raw gas to react with the reactant gas by the aid of the plasma (see, for instance, Japanese Un-Examined Patent Publication 2003-318174 (see, for instance, claims)).

More specifically, it has been known that when forming a $ZrB_2$ film as a barrier layer using $Zr(BH_4)_4$ as such a raw material, such a barrier film can be formed according to the following reaction equations (1) and (2):

$$Zr(BH_4)_4 \rightarrow ZrB_2 + B_2H_{6+5}H_2 \qquad (1)$$

$$Zr(BH_4)_4 + H_2 \rightarrow ZrB_2 + B_2H_{6+6}H_2 \qquad (2)$$

The foregoing reaction equation (1) corresponds to a method in which a $ZrB_2$ film is formed on a substrate by directly and thermally decomposing a raw material using only the thermal assist of the Si substrate heated by an appropriate means and in this case, an excellent $ZrB_2$ film can be formed only when the substrate is heated to a high temperature on the order of not less than 550° C. On the other hand, the foregoing reaction equation (1) corresponds to a method in which hydrogen radicals are added to a raw material, a reaction of the raw material is induced by the hydrogen radical and the thermal assist of the Si substrate at a relatively low temperature (on the order of 300 to 350° C.) to thus form a $ZrB_2$ film on the substrate. In this case, the addition of the hydrogen radical would permit the reduction of the substrate temperature or the reaction temperature required for forming a desired thin film. As an example of such a method, there has been reported one which comprises the steps of forming a $ZrB_2$ film on a substrate, as a barrier film, at such a low temperature of about 300° C. while making use of the remote plasma CVD technique (see, for instance, J. Appl. Phys., Vol. 91, No. 6, March 2002, pp. 3904-3907 (see, for instance, p. 3904).

Incidentally, to form a thin film by repeating the formation of a mono-atomic layer by the ALD technique over desired times, it is quite desirable that the process conditions such as substrate temperature can separately and independently be set or established in the foregoing adsorption and reaction steps. However, the foregoing conventional technique never permits the separate and independent setting of such process conditions, but simply the raw and reactant gases can separately and periodically be fed to the substrate and accordingly, i.e. there is a time lag between a raw gas introduction and a reactant gas introduction, and a thin film is formed by repeatedly depositing a layer having a thickness of several atoms.

In this connection, if an ALD apparatus is so designed that it comprises a conveying chamber equipped with an evacuation means and a plurality of processing chambers are arranged around the conveying chamber so that a substrate can freely be transferred between the neighboring processing chambers by the action of the substrate-conveying means disposed within the conveying chamber, the foregoing adsorption and reaction steps may separately and independently be conducted. In this method, however, a substrate is moved between the neighboring processing chambers after once transferring the substrate to a conveying chamber. Accordingly, this suffers from such problems that it takes a long period of time for the transfer of the substrate and that this in turn makes, impossible, the reduction of the cycle time for the formation of desired thin films. Furthermore, it would be necessary for this technique to dispose a conveying chamber, and an evacuation means and a vacuum indicator for each processing chamber and this accordingly makes the structure of the apparatus complicated and considerably increases the cost required for the manufacture of the same.

In addition, the film-forming temperature is extremely high in the method for forming a $ZrB_2$ film, as a barrier film, by directly, thermally decomposing a raw material while making use of the reaction according to the reaction equation (1) and therefore, this method would be accompanied by the foregoing drawbacks or troubles in the case of distributing wire layers of semiconductor devices in which Cu and/or Al are used as materials for the distributing wires.

Moreover, the method for forming a barrier film while making use of the reaction according to the reaction equation (2) can reduce the film-forming temperature to a level lower than that used in the reaction equation (1), but any film of, for instance, a $ZrB_2$ film cannot be formed in fine holes having a high aspect ratio in a high coverage. In this case, the principal reaction is a gaseous phase reaction between $Zr(BH_4)_4$ and hydrogen radicals and therefore, this technique suffers from a problem in that an overhang of a $ZrB_2$ film is formed on the upper portion of each hole or trench and in the worst case, the upper portion of each hole or trench is completely clogged.

DISCLOSURE OF THE INVENTION

Accordingly, it is an object of the present invention, in a broad sense, to solve the foregoing problems associated with the conventional techniques and more specifically to provide a vacuum film-forming apparatus which permits the separate and independent establishment of the processing conditions for adsorption and reaction steps and permits the formation of a thin film having excellent quality by the acceleration of the reaction between a raw gas and a reactant gas; which is so designed that it can improve or reduce the cycle time of the film-forming process; and which can be manufactured at a lower cost. In the case of forming a thin film on a substrate by using the foregoing apparatus, it is possible to form a thin film on the inner walls of, for instance, fine holes and/or trenches in a good coverage without being accompanied by the formation of any overhang on the upper portion of these holes and trenches.

According to an aspect of the present invention, there is provided a vacuum film-forming apparatus as an ALD apparatus, the apparatus being characterized in that it comprises a plurality of substrate stages for placing a subject (hereunder referred to as "substrate(s)") on which a desired film is deposited and capable of freely moving up and down; a plurality of containers, each serving as a vacuum chamber (hereunder referred to as "vacuum chamber-forming container(s)"), which are arranged in such a manner that they are opposed to the plurality of substrate stages and which can freely move up and down; a conveying means for moving the substrate between the plurality of substrate stages; and a plurality of gas-introduction means which are separately connected to every corresponding vacuum chamber-forming containers, wherein the apparatus is so designed that, upon practicing the film-forming process, one of the substrate stage and the vacuum chamber-forming container is ascended or descended towards the other or both of them are simultaneously ascended or descended to thus bring the upper face of the substrate stage and the opening of the vacuum chamber-forming container into contact with one another so that each corresponding vacuum chamber can be formed, which is surrounded by each corresponding pair comprising the substrate stage and the vacuum chamber-forming container and that a desired raw gas and/or a reactant gas can be introduced into every spaces of the plurality of the vacuum chambers thus formed through the gas-introduction means to thus carry out therein either the adsorption step in which the raw gas is adsorbed on the substrate or the reaction step for allowing the adsorbed raw gas to react with the reactant gas.

More specifically, the foregoing film-forming apparatus is so designed that after placing a substrate on the substrate stage and forming the corresponding vacuum chamber from the substrate stage and the vacuum chamber-forming container, a desired raw gas is introduced into the space thus formed through the gas-introduction means to thus carry out an adsorption step in which the raw gas is adsorbed on the surface of the substrate; that after the space is then opened, the substrate carrying the raw gas adsorbed on the surface thereof is transferred to another substrate stage by the action of the conveying means; that after forming a vacuum chamber from the another substrate stage and another vacuum chamber-forming container, a desired reactant gas is introduced into the resulting space through the gas-introduction means to thus carry out a reaction step in which the adsorbed raw gas is allowed to reacted with the reactant gas introduced; and that a series of the foregoing adsorption and reaction steps are repeated over a predetermined times to thus form a thin film having a desired thickness.

In this case, the film-forming apparatus is likewise so designed as to simultaneously form a plurality of vacuum chambers and spaces, in which either an adsorption step or a reaction step can be conducted, within the apparatus and accordingly, the use of this apparatus would permit the separate and independent establishment of the process conditions for carrying out the adsorption and reaction steps for the further improvement or acceleration of the reaction and this in turn permit the formation of a thin film having high quality. Moreover, it is not necessary to separately dispose a conveying chamber for transferring a wafer (or a substrate) during the film-forming process. This would permit the substantial reduction of the time required for conveying a substrate on which a desired thin film is deposited and as a result, this in turn reduces the cycle time of the film-forming process and thus the apparatus can be manufactured at a low cost.

According to a preferred embodiment, the apparatus further comprises a unit for generating plasma (a plasma generator) which is positioned at the exterior of at least one of the foregoing vacuum chamber-forming container. If a plasma generator is provided at least for each space wherein an adsorption step is carried out among other spaces, the surface of the substrate and the inner wall surfaces of the spaces can be purified by the irradiation thereof with the plasma thus generated and accordingly, any impurity possibly present thereon can substantially be removed, prior to, for instance, the adsorption of a raw gas onto the substrate surface. In this respect, such a plasma generator may likewise be provided for each space for carrying out a reaction step. In this case, the plasma generator may serve to activate a reactant gas to thus accelerate the desired reaction.

According to another embodiment, the film-forming apparatus is characterized in that a catalytic means is provided, which is connected to the vacuum chamber-forming container for carrying out a reaction step and placed on the exterior of the film-forming apparatus or within the vacuum chamber for carrying out a reaction step, so that a reactant gas excited by the catalytic means can be introduced into the reaction space. Thus, the apparatus permits the introduction of an excited reactant gas into the reaction space and therefore, the reaction can be accelerated to thus give a thin film having excellent quality.

According to a further preferred embodiment of the film-forming apparatus, the foregoing catalytic means and the vacuum chamber-forming container in which the reaction step is carried out are equipped with cooling means. Such cooling means would permit the inhibition or control of any excessive increase in the temperature within the reaction space including the substrate due to the heat generated by, for instance, a catalyst such as a tungsten wire.

According to still another preferred embodiment, the apparatus is characterized in that the dimensions of the opening of the vacuum chamber-forming container and the substrate stage are so designed that a gap having a desired size can be formed between the inner peripheral face of the opening and the outer peripheral face of the substrate stage when practicing the adsorption and/or reaction steps in the spaces established within the vacuum chamber and that the exhaust gas can be discharged from the apparatus through the gap. If the apparatus has such a structure capable of forming such a gap, the pressure in the space may be maintained at a desired level when introducing a desired gas into the space. In this case, the size of the gap may be changed to control the conductance.

According to a further preferred embodiment of the foregoing apparatus, the vacuum chamber-forming container is so designed that it has a bell-jar shape.

According to a still further preferred embodiment of the foregoing apparatus, each of the foregoing plurality of substrate stages is equipped with a means for heating a substrate on which a desired film is deposited. If each substrate stage is thus provided with such a heating means, the substrate placed on the stage can separately be heated to a temperature suitable for carrying out each of the adsorption and reaction steps.

According to another aspect of the present invention, there is also provided a vacuum film-forming apparatus as an ALD apparatus, the apparatus being characterized in that it comprises a turn table for placing and transferring a substrate on which a desired film is deposited and capable of freely moving up and down; a plurality of vacuum chamber-forming containers, which are arranged in such a manner that they are opposed to the turn table and which can freely move up and down; and a plurality of gas-introduction means which are separately connected to every corresponding vacuum chamber-forming containers, wherein the apparatus is so designed that upon practicing the film-forming process, one of the turn table and the vacuum chamber-forming container is ascended or descended towards the other or both of them are simultaneously ascended or descended to thus bring the upper face of the turn table and the opening of the vacuum chamber-forming container into contact with one another so that a plurality of vacuum chambers can be formed, each of which is surrounded by a part of the turn table and each corresponding vacuum chamber-forming container and that a desired raw gas and/or a desired reactant gas can be introduced into every spaces of the plurality of the vacuum chambers thus formed through the gas-introduction means to thus carry out therein either the adsorption step in which the raw gas is adsorbed on the surface of the substrate or the reaction step for allowing the adsorbed raw gas to react with the reactant gas.

In this case, the turn table for placing the substrate also functions as a means for conveying the substrate and therefore, the turn table would permit the simultaneous transfer of a plurality of substrates. In addition, when the turn table is so designed that it can rotate only in one direction, the adsorption and reaction steps can, in order, be conducted by conveying the substrates synchronous with the rotation of the turn table.

Incidentally, when simultaneously carrying out the adsorption and reaction steps for a plurality of substrates, it is sufficient that a plurality of vacuum chambers can simultaneously be formed by appropriately controlling the movement of the turn table and the vacuum chamber-forming containers.

According to a preferred embodiment of the foregoing apparatus, the turn table is provided with, on the same circumference of a circle, a plurality of trough holes the number of which is identical to that of the vacuum chamber-forming containers; a member for supporting each substrate is disposed at the periphery of each though hole; and the apparatus is provided with a substrate stage, as a means for ascending and descending the substrate placed thereon, which can freely go up and down and which can pass through the hole. This substrate stage also takes part in the formation of a vacuum chamber together with the turn table and vacuum chamber-forming container upon the practice of the process.

According to another preferred embodiment of the foregoing apparatus, the apparatus further comprises a unit for generating plasma which is positioned at the exterior of at least one of the foregoing vacuum chamber-forming container. If the unit for generating plasma is provided at least for each space wherein an adsorption step is carried out among other spaces, the surface of the substrate and the inner wall surfaces of the spaces can be purified by the irradiation thereof with the plasma thus generated and accordingly, any impurity possibly present thereon can substantially be removed, prior to, for instance, the adsorption of a raw gas onto the substrate surface. In this respect, such a plasma-generating unit may likewise be disposed in each space for carrying out a reaction step. In this case, the plasma-generating unit may serve to activate a reactant gas to thus accelerate the desired reaction.

According to still another embodiment of the film-forming apparatus, it is characterized in that a catalytic means is provided, which is connected to the vacuum chamber for carrying out a reaction step and placed on the exterior of the film-forming apparatus or within the vacuum chamber for carrying out a reaction step so that a reactant gas excited by the catalytic means can be introduced into the reaction space. Thus, the apparatus permits the introduction of an excited reactant gas into the reaction space and therefore, the reaction can be accelerated to thus give a thin film having excellent quality.

According to a further preferred embodiment of the film-forming apparatus, the foregoing catalytic means and the vacuum chamber-forming container in which the reaction step is carried out are equipped with a cooling means. Such a cooling means would permit the inhibition or control of any excessive increase in the temperature within the reaction space including the substrate due to the heat generated by, for instance, a catalyst such as a tungsten wire.

According to a still further preferred embodiment of the film-forming apparatus, the apparatus is characterized in that a plurality of exhaust ports are provided in the vicinity of the external periphery of the substrate-supporting member. If the apparatus is provided with such exhaust ports so that the film-forming apparatus can externally be exhausted, the pressure of the space can be maintained at a desired level when introducing a desired gas into the space. In this case, the conductance of the apparatus can be adjusted by arbitrarily varying the size of each exhaust port.

According to a further preferred embodiment of the foregoing apparatus, the vacuum chamber-forming container is one having a bell-jar shape.

According to a still further preferred embodiment of the foregoing apparatus, each of the foregoing plurality of substrate stages is equipped with a means for heating a substrate on which a desired film is deposited. If each substrate stage is thus provided with such a heating means, the substrate placed on the stage can separately be heated to a temperature suitable for carrying out each of the adsorption and reaction steps.

According to a further preferred embodiment of the film-forming apparatus, the apparatus is further provided with a stage-supporting table, in the interior of which is provided with an exhaust passage or path, for placing the substrate stage. The use of such an exhaust means would permit the prevention of the formation of any particle due to a gas-phase reaction caused by mixing of a raw gas and reactant gas within the film-forming apparatus.

As has been described above in detail, the vacuum film-forming apparatus according to the present invention permits the independent establishment of the process conditions for adsorption and reaction steps, the acceleration of the reaction between a raw gas and a reactant gas and the formation of a thin film having more excellent film quality. Moreover, the apparatus likewise permits the considerable reduction of the cycle time of film-forming processes and the apparatus can be manufactured at a low cost.

Moreover, the thin vacuum film-forming apparatus according to the present invention permits the practice of adsorption and reaction steps at a low temperature according to the ALD technique and the apparatus would permit, for instance, the formation of a thin film even on the inner walls of fine holes and/or trenches having a high aspect ratio in a high coverage without causing any overhanging phenomenon at the upper portions of, for instance, these fine holes and/or trenches.

BRIEF DESCRIPTION OF THE DRAWINGS

The present invention will hereunder be described in more detail with reference to the accompanying drawings, wherein.

DESCRIPTION OF THE PREFERRED EMBODIMENTS

Figure 1:
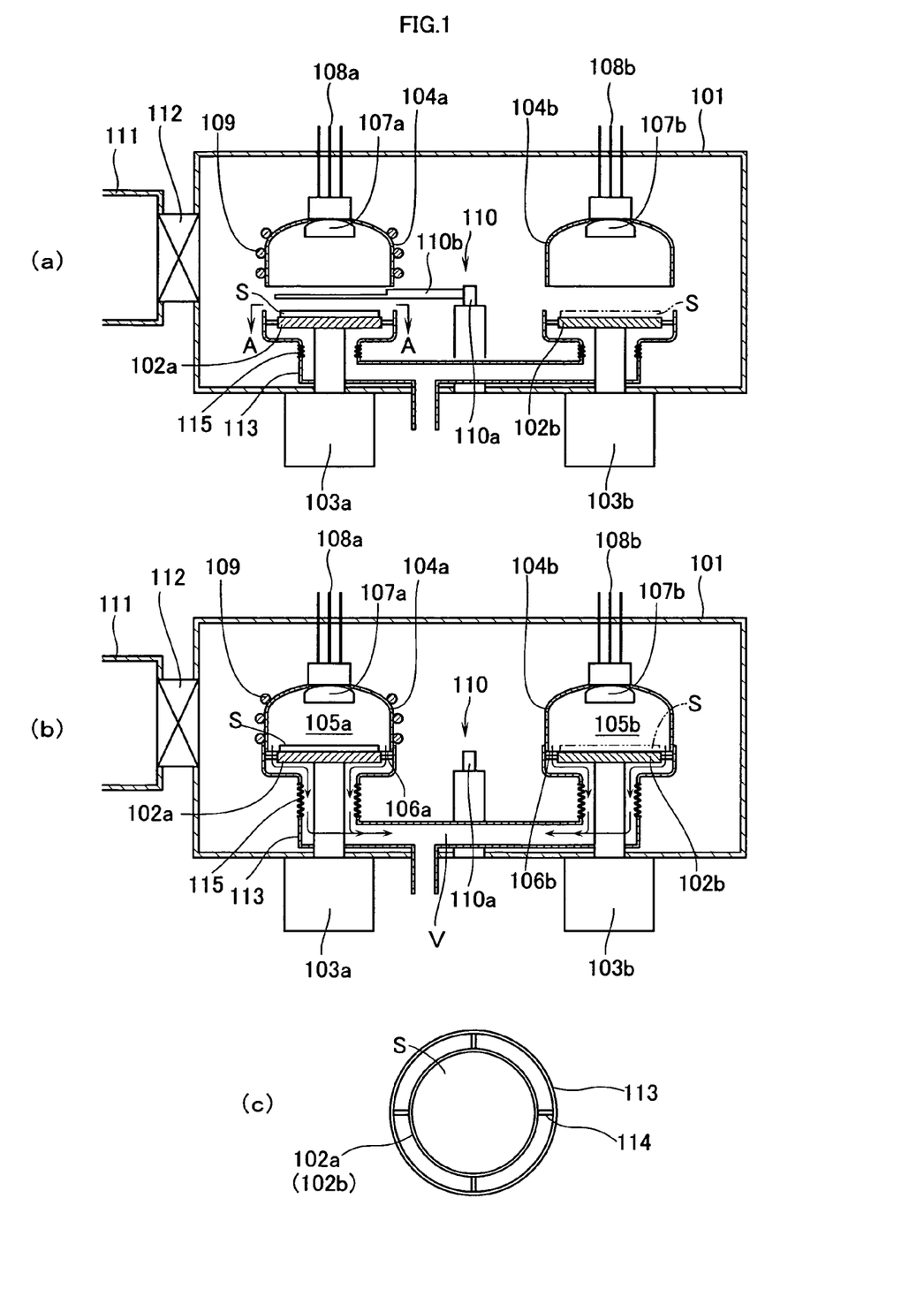
FIG. 1 shows a schematic block diagram for illustrating an embodiment of the vacuum film-forming apparatus according to the present invention and more specifically, wherein (a) is a diagram showing the structure of the apparatus observed during the step of conveying a substrate on which a film is formed; (b) is a diagram showing the structure of the apparatus observed during the film-forming step and (c) is a top plan view observed from the direction A-A specified in FIG. 1(a)

First of all, an embodiment of the vacuum film-forming apparatus (an atomic layer deposition apparatus (ALD apparatus)) according to the present invention will be described below in detail while referring to FIGS. 1(a) to (c) attached hereto. In FIG. 1, (a) is a cross sectional view schematically showing the structure of the apparatus observed during the step of conveying a subject on which a film is formed or a substrate; (b) is a cross sectional view schematically showing the structure of the apparatus observed when putting the film-forming step into practice; and (c) is a top plan view observed from the direction A-A specified in FIG. 1(a).

The vacuum film-forming apparatus 101 as shown in FIG. 1 is connected to an evacuation means (not shown) such as a turbo-type molecular pump or a rotary pump such that any suitable degree of vacuum (for instance, $1 \times 10^{-6}$ Torr) can be established in the interior of the film-forming apparatus. A plurality of substrate stages 102a and 102b (the apparatus shown in FIG. 1 is provided with two such substrate stages) each capable of receiving a substrate S on which a thin film is formed are disposed in the vacuum film-forming apparatus 101 and each of these substrate stages 102a and 102b is so designed that it can freely ascend and descend by the action of a driving means 103a and 103b such as a motor or an air cylinder.

Each of these substrate stages 102a and 102b is provided with a built-in heating means (not shown) such as a resistance heater and thus each substrate stage can heat substrate S to a desired temperature. Moreover, in the vacuum film-forming apparatus 101, bell-jar shaped vacuum chamber-forming containers 104a and 104b are arranged in such a manner that they are opposite to every corresponding substrate stages 102a and 102b so that each pair of the substrate stage and the bell-jar shaped vacuum chamber-forming container can form each corresponding vacuum chamber (the apparatus as shown in FIG. 1 includes two vacuum chambers) when putting the film-forming process into practice. For instance, when ascending the substrate stage 102a or 102b, the opening of the corresponding bell-jar shaped vacuum chamber-forming container 104a or 104b covers each substrate stage to thus form each corresponding vacuum chamber and each space 105a or 105b within the vacuum chamber thus formed functions as a chamber for practicing the film-forming process, in which the adsorption and reaction steps are conducted.

When practicing the foregoing film-forming process, the substrate stages 102a and 102b are elevated by the operation of the driving means 103a and 103b so that the substrates S placed on these substrate stages 102a and 102b are arranged within the resulting spaces 105a and 105b, respectively. In this respect, the dimensions of the openings of the bell-jar shaped containers 104a and 104b and those of the cross section of the substrate stages are so designed that a gap 106a or 106b having a desired size can be formed between the outer peripheral side wall of each substrate stage 102a or 102b and the inner peripheral face of the opening of each bell-jar shaped container 104a or 104b. Thus, when introducing a desired gas into each of spaces 105a and 105b, the gas can externally be evacuated from the space through each gap 106a or 106b to thus maintain the pressure within each space 105a or 105b at a predetermined level (see FIG. 1(b)). In this case, the gas discharged from the space is externally discharged from the apparatus through an exhaust passage V connected to the gap. Regarding this exhaust passage, each vacuum chamber may separately be provided with each particular exhaust passage or a plurality of vacuum chambers may be connected to a common exhaust passage through which the exhaust gas may be discharged, as will be seen from FIG. 1. In this connection, the size of each gap 106a or 106b can be changed to control the conductance thereof.

Gas-introduction means 107a and 107b having a known structure are disposed on the ceiling portions of the bell-jar shaped containers 104a and 104b in such a manner that they are opposed to the substrates S on which a thin film is formed. These gas-introduction means 107a and 107b are so designed that they are connected to corresponding gas sources (not shown) through pipe lines 108a and 108b for gas passage, respectively, and that a desired raw gas can thus be introduced into the space 105a of one vacuum chamber to conduct the adsorption step, while a desired reactant gas can be introduced into the space 105b of the other vacuum chamber to conduct the reaction step. It is a matter of course that these adsorption and reaction steps can likewise be carried out by introducing a raw gas into the space 105b and a reactant gas into the space 105a. In this respect, these adsorption and reaction steps can be carried out in the space of the same vacuum chamber, but this would be undesirable in that there is a problem of the presence of residual gases.

On the other hand, in the case of a vacuum chamber for carrying out the adsorption step, a plasma generator having an RF coil 109 connected to a radiofrequency power source is provided on the outer wall of the container 104a having a bell-jar shape so that the plasma of, for instance, argon can be generated in the space 105a prior to the initial adsorption of a raw gas onto the surface of a substrate S on which a film is to be formed, in order to make the surface of the substrate S clean by the irradiation with the plasma or that $NF_3$ gas can be passed through the apparatus while operating the plasma generator to thus purify the interior of the vacuum chamber.

When carrying out the reaction step while introducing a reactant gas into the space 105b, it is desirable that the reaction of the raw gas with the reactant gas can be accelerated without excessively increasing the temperature of the substrate S. To this end, for instance, a plasma generator having an RF coil (not shown) connected to a radiofrequency power source may be disposed on the outer wall of the container 104b having a bell-jar shape so that an argon plasma is generated within the space 105b to thus carry out a plasma-assisted reaction step.

It is also preferred that the foregoing vacuum film-forming apparatus 101 is provided with a means for exciting the reactant gas to be introduced into the space 105b for carrying out the reaction step to thus form radicals of the gas. If it is intended to supply, onto the surface of the substrate S, the reactant gas excited and converted into radicals, the apparatus may, for instance, be designed as follows: a catalytic means (not shown) such as a tungsten catalyst wire is disposed in a gas piping 108b connected to a gas-introduction means 107b to thus supply the excited reactant gas onto the substrate S through the gas-introduction means equipped with a shower plate or a dispersion plate; or the foregoing catalytic means is arranged within the space 105b and on the downstream side of a shower plate or a dispersion plate of the gas-introduction means 107b and the reactant gas to be introduced into the space is first excited by the action of the catalyst and then supplied to the substrate S through the shower plate or the dispersion plate.

In the case where the apparatus is provided with the foregoing catalytic means, for instance, within the space 105b, it is preferred that the shower plate or the dispersion plate made of, for instance, quartz or alumina is equipped with a cooling means such as a water-cooling piping. The use of such a cooling means would permit the control of any undesirable temperature increase in the space due to the heat generated by the catalytic wire observed when applying an electric current to the catalytic means. It is preferred that a cooling means may likewise be disposed on the outer wall of the container 104b having a bell-jar shape which constitutes the space 105b, in addition to the place in the proximity to, for instance, the shower plate to thus control the temperature in the space 105b.

The foregoing catalytic means will be described below in more detail with reference to an embodiment of the catalyst means schematically shown in FIG. 2. The excited reactant gas is generated within a catalyst chamber 202 connected to and communicated with a vacuum chamber through a valve 201. Arranged within the catalyst chamber 202 is, for instance, a wire 203 consisting of a known catalyst metal for excitation such as tungsten (W) and a cooling means 204 is attached to the outer wall of the catalyst chamber 202. Moreover, the apparatus is likewise so designed that an exhaust means 205 consisting of a vacuum pump such as a turbo-type molecular pump is also connected to the catalyst chamber 202 and that the catalyst chamber can thus be evacuated to a pressure on the order of, for instance, 0.1 to 10 Torr (13.3 to 1333.3 Pa). In this respect, the reactant gas cannot be excited efficiently at a pressure beyond the range specified above. In this connection, a vent line 207 may be established by arranging a valve 206 between the catalyst chamber 202 and the exhaust means 205, the vent line being established between the valve 206 and the catalyst chamber 202. The establishment of such a vent line would permit the inhibition of any change of the pressure in the catalyst chamber by opening or closing a valve 201 such as an isolation valve for dividing the catalyst chamber 202 from the vacuum chamber. The reactant gas is introduced into the catalyst chamber 202 through a gas-introduction port 202a.

A substrate-conveying means 110 is arranged between substrate stages 102a and 102b as shown in FIG. 1. This substrate-conveying means 110 has a shaft member 110a which can freely go up and down through the action of a driving means (not shown) such as a motor or an air cylinder and an arm 110b, which can freely rotate round the shaft serving as a center, is attached to one end of the shaft member 110a. The arm 110b can appropriately be rotated while the shaft member 110a is ascended or descended so that a substrate S on which a film is formed can be transferred from the substrate stage 102a to the substrate stage 102b or vice versa.

In addition, a substrate-conveying chamber (a road-lock chamber) 111 is connected to the foregoing vacuum film-forming apparatus 101 through a gate valve 112 and the substrate S can thus be transferred from the vacuum film-forming apparatus 101 and the road-lock chamber 111 by the operation of a substrate-conveying means such as a robot disposed within the road-lock chamber.

In FIG. 1, the reference numeral 113 represents an exhaust means provided with an exhaust path V.

The foregoing vacuum film-forming apparatus 101 is provided with a separately formed vacuum chamber having a space 105a for carrying out an adsorption step and a vacuum chamber having a space 105b for carrying out a reaction step.

For this reason, process conditions for such adsorption and reaction steps can independently be established according to the method for forming a thin film such as a barrier film while using this vacuum film-forming apparatus and therefore, the reaction between a raw gas and a reactant gas can be accelerated to thus give a thin film having excellent quality. This further allows the reduction of the time required for the transfer of the substrate S and as a result, the cycle time required for carrying out the film-forming process can thus be reduced. Moreover, the apparatus can thus be manufactured at a low cost.

Figure 3:
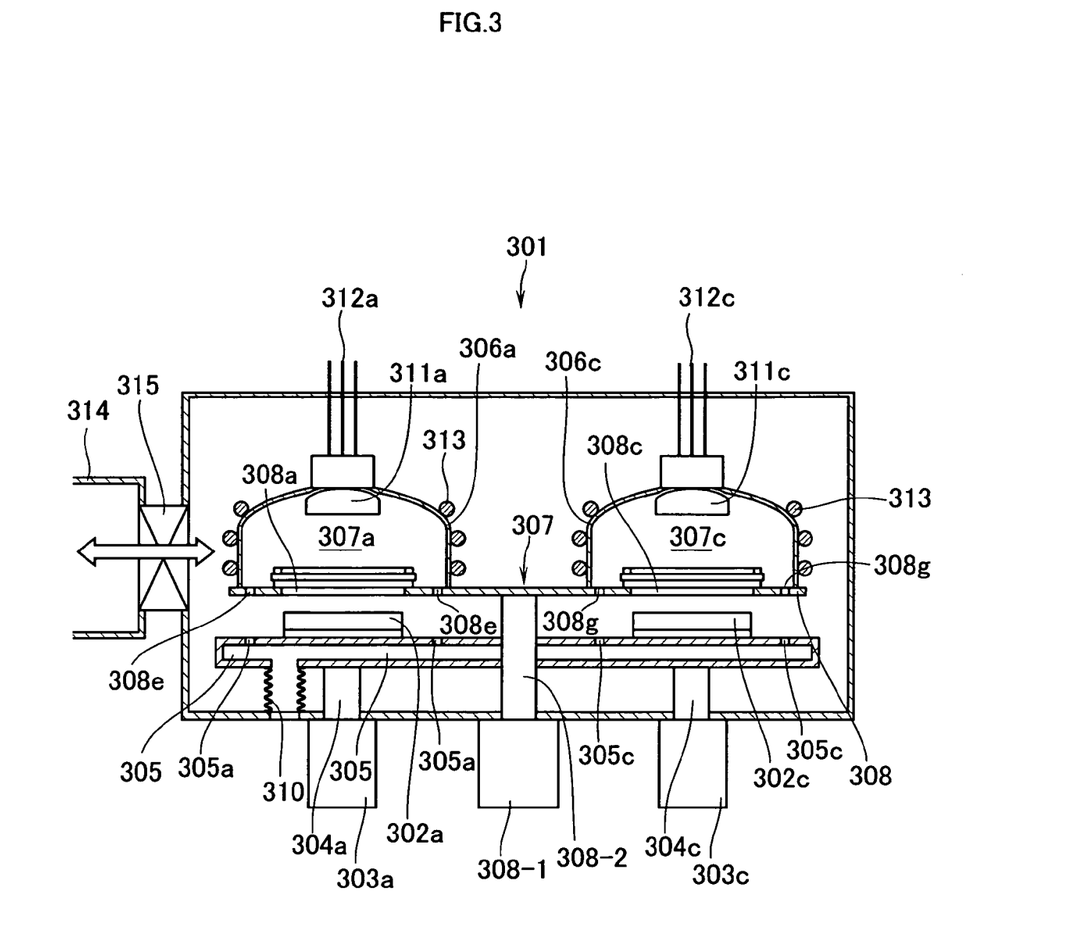
FIG. 3 is a schematic diagram for illustrating another embodiment of the vacuum film-forming apparatus according to the present invention.
Figure 4:
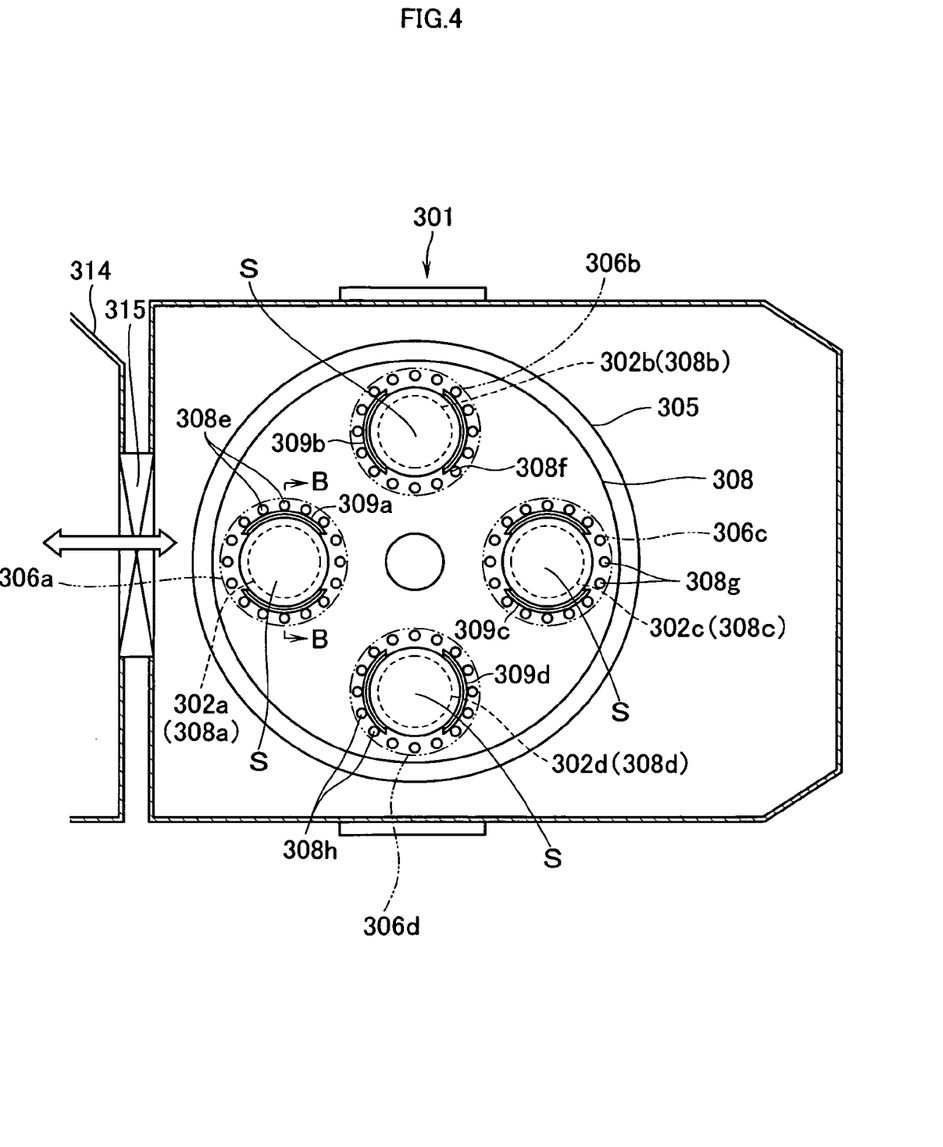
FIG. 4 is a top plan view of the vacuum film-forming apparatus as shown in FIG. 3 from which the bell-jar shaped container is removed.
Figure 5:
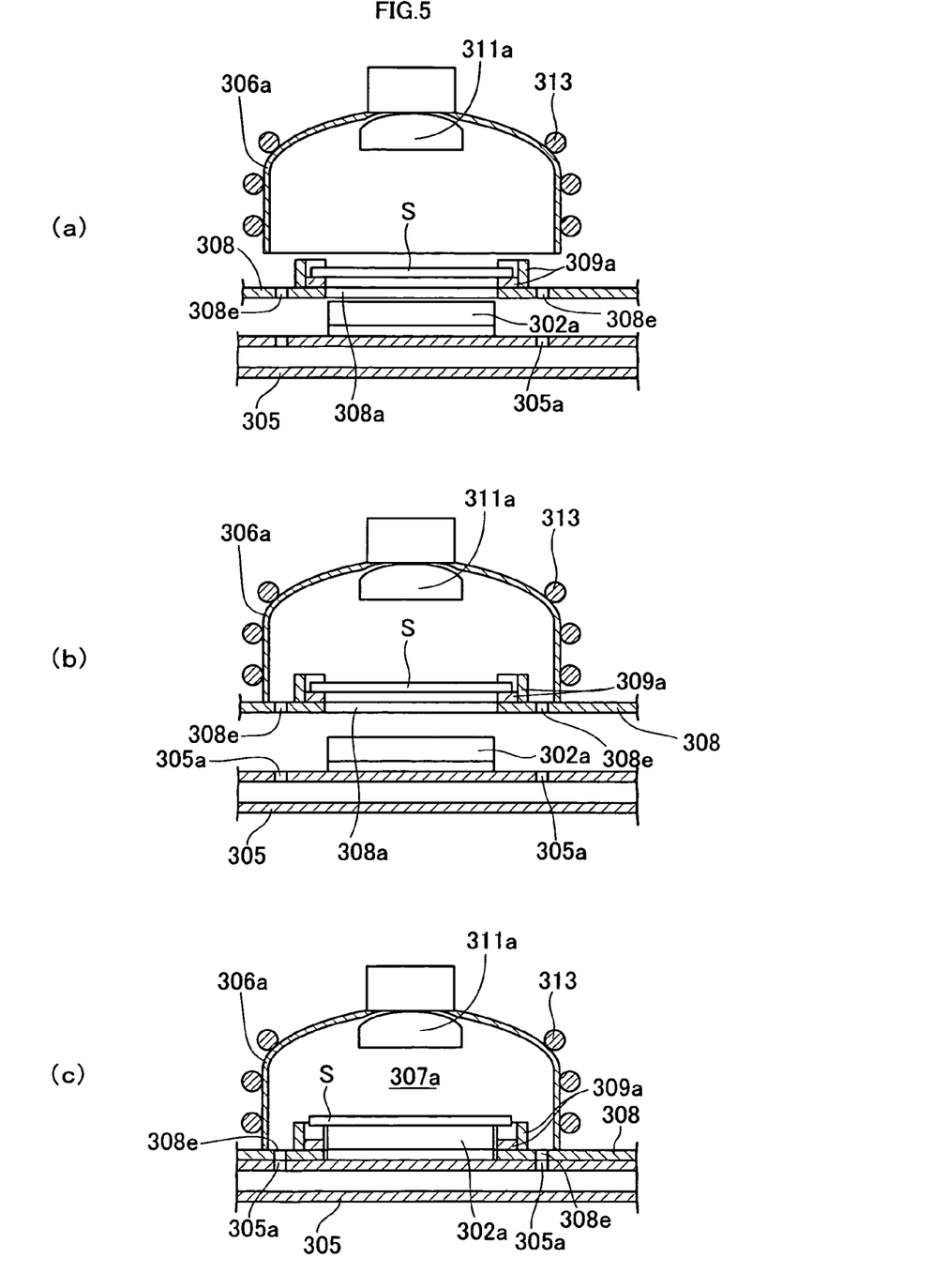
FIG. 5 is a block diagram for explaining the method for conveying a substrate on which a film is formed when a thin film is formed using the vacuum film-forming apparatus as shown in FIG. 3 or 4 and this is a cross sectional view taken along the line B-B specified in FIG. 4, wherein (a) corresponds to a schematic side view of the apparatus observed during the step of conveying the substrate; (b) corresponds to a schematic side view of the apparatus observed when a vacuum chamber is formed; and (c) corresponds to a schematic side view of the apparatus observed when the film-forming process is put into practice.

Then, a vacuum film-forming apparatus according to another embodiment of the present invention will be described in detail below with reference to the accompanying drawings FIGS. 3 to 5. FIG. 3 is a schematic diagram showing the structure of a vacuum film-forming apparatus in which a vacuum chamber formed is surrounded by a turn table and a container having a bell-jar shape. FIG. 4 is a top plan view of the vacuum film-forming apparatus as shown in FIG. 3 from which the bell-jar-shaped container is removed. Further FIG. 5 is a schematic block diagram for explaining a film-forming process for forming a thin film such as a barrier film and this is a cross sectional view taken along the line B-B specified in FIG. 4, wherein (a) corresponds to a condition observed during the step of conveying the substrate on which a film is formed; (b) corresponds to a condition observed when a vacuum chamber is formed; and (c) corresponds to that observed when the film-forming process is put into practice.

The vacuum film-forming apparatus (an ALD apparatus) 301 shown in FIGS. 3 to 5 has a structure approximately identical to the vacuum film-forming apparatus 101 shown in FIG. 1, but the former is so designed that it can simultaneously process a plurality of substrates S (in this case, four substrates are shown) on which a thin film is formed. For the convenience of the drawing up of figures and for making the explanation simple, there are shown two vacuum chambers in FIG. 3, four vacuum chambers in FIG. 4 and only one vacuum chamber in FIG. 5.

There are disposed four substrate stages 302a, 302b, 302c and 302d within the vacuum film-forming apparatus 301 equipped with an evacuation means, each of these substrate stages is so designed that it can freely go up and down by the action of a driving shaft 304a, 304b, 304c or 304d of a driving means 303a, 303b, 303c or 303d such as a motor or an air cylinder, and mounted on and fixed to a stage-supporting table 305 also serving as an exhaust means as will be detailed later. In this case, these four substrate stages are arranged on the same circumference of a circle at equal spaces.

Each substrate stage 302a to 302d is equipped with a built-in heating means (not shown) such as a resistance heater and the substrate S can thus be heated to a desired temperature for each substrate stage. In addition, the vacuum film-forming apparatus 301 is also provided therein with bell-jar-shaped containers 306a, 306b, 306c and 306d each of which is opposed to each corresponding substrate stage 302a to 302d. Each bell-jar-shaped container forms a vacuum chamber upon the practice of the film-forming process. For instance, when elevating a turn table as will be described later towards to opening of the bell-jar-shaped container (or when bringing each bell-jar-shaped container down to the turn table), the opening of each bell-jar-shaped container is covered with the turn table so that four vacuum chambers can be formed and accordingly, the space 307a, 307b, 307c or 307d of each vacuum chamber may function as a film-forming chamber in which the adsorption and reaction steps are carried out in a predetermined order.

Disposed within the vacuum film-forming apparatus 301 is a turn table 308 which also serves as a substrate-conveying means for transporting the substrate S. The turn table 308 is provided with circular through holes 308a, 308b, 308c and 308d arranged on the same circumference of a circle at equal spaces and the number of which is identical to that of the bell-jar-shaped containers so that, in the practice of the film-forming process, each substrate stage can pass through each corresponding through hole when the stage-supporting table 305 is ascended by the operation of each driving shaft 304a to 304d capable of freely going up and down and connected to each corresponding driving means 303a to 303d. Substrate-supporting members 309a, 309b, 309c and 309d for holding substrates S, on which a film is formed, are disposed on the turn table 308 and at least part of the peripheral region of each through hole. The turn table 308 is likewise so designed that it can freely be rotated by the action of a driving shaft 308-2 connected to a driving means 308-1.

The stage-supporting table 305 may also be freely rotatable.

In this connection, it is preferred that the turn table 308 should be elevated till each opening of the bell-jar-shaped container 306a to 306d is completely covered with the upper face of the turn table 308. In this case, the turn table 308 is provided with a plurality of exhaust holes 308e, 308f, 308g and 308h for the evacuation of each space 307a to 307d, which are arranged in the proximity to the outer peripheral wall of each corresponding substrate-supporting member 309a to 309d so that the pressure in each space can be maintained at a desired level when introducing a desired gas into the space. The number of exhaust holes 308e to 308h and the area of the opening thereof may be changed so as to control the conductance. In this connection, the upper face of the turn table 308 may slightly be separated from the side of the opening of each bell-jar-shaped container 306a to 306d. In this case, however, the presence of such an interstice is not preferred from the viewpoint of the control of the conductance since the resulting interstice may likewise serve as an exhaust when introducing a desired gas into the space 307a to 307d.

As has been described above, each space 307a to 307d is evacuated through the exhaust hole 308e to 308h formed through the turn table 308. At this stage, it is necessary to prevent the formation of any particle, which may be formed as a result of the admixture of a raw gas and a reactant gas within the vacuum film-forming apparatus 0301 and due to the gas-phase reaction taken place between them. To this end, the apparatus is preferably designed as follows: an exhaust path is formed in the stage-supporting table 305 and exhaust ports 305a, 305b, 305c and 305d are arranged at positions in good agreement with the exhaust holes 308e to 308h so that the stage-supporting table also functions as an exhaust means and that the exhaust holes may communicate with the exhaust ports during the adsorption step or the reaction step (FIG. 5(c)). In this case, the outlet of the exhaust path is connected to the wall face of the vacuum film-forming apparatus 301 through a piping 310 such as a bellows type one so that the stage-support member (or the exhaust path) may go up and down in response to the action or movement of the substrate stage 302a to 302d. The position of placing the piping 310 is not particularly restricted, if the gas is uniformly exhausted out of the apparatus through the exhaust path. The piping 310 may be placed as shown in FIG. 3. The conductance is controlled according to each film-forming process. These exhaust paths are preferably so designed that they can be combined into one as shown in FIG. 3 to thus externally discharge gases out of the vacuum film-forming apparatus 301.

Each bell-jar-shaped container 306a to 306d is provided, on its ceiling, with a gas-introduction means 311a, 311b, 311c or 311d which is equipped with a shower plate or a dispersion plate having a known structure and which faces each corresponding substrate S to be deposited with a film so that a raw gas may be introduced into, for instance, the bell-jar-shaped containers 306a and 306c or a reactant gas may be introduced into, for instance, the bell-jar-shaped containers 306b and 306d through gas piping works 312a, 312b, 312c and 312d. In this case, it is also possible to introduce a reactant gas into the bell-jar-shaped containers 306a and 306c and a raw gas into the bell-jar-shaped containers 306b and 306d. Thus, if the raw gas and reactant gas are introduced in this manner and the turn table 308 is rotated in one direction, the adsorption and reaction steps can continuously be carried out while stepwise feeding, in order, the substrate S to be deposited with a desired film.

Moreover, each bell-jar-shaped container may be provided, on its outer wall, with a plasma generator having an RF coil 313 connected to a radiofrequency power source, like the bell-jar-shaped container as shown in FIG. 1. The details thereof are the same as those described above in connection with FIG. 1 and therefore, the description thereof will be omitted herein.

In addition, the vacuum film-forming apparatus 301 is preferably provided with a catalytic means as a means for exciting a reactant gas to be introduced into the space for practicing the desired reaction step and converting the same into radicals, like the vacuum film-forming apparatus 101 as shown in FIG. 1. The details thereof are likewise the same as those described above in connection with FIG. 1 and therefore, the description thereof will be omitted herein.

Furthermore, a substrate-conveying chamber (a road-lock chamber) 314 is connected to the vacuum film-forming apparatus 301 through a gate valve 315 and the substrate S can thus be transferred from the vacuum film-forming apparatus 301 and the road-lock chamber 314 by the operation of a substrate-conveying means (not shown) such as a robot disposed within the road-lock chamber.

The foregoing vacuum film-forming apparatus 301 is provided with a separately formed vacuum chamber having a space for carrying out an adsorption step and a vacuum chamber having a space for carrying out a reaction step. For this reason, process conditions for such adsorption and reaction steps can independently be established according to the method for forming a thin film such as a barrier film while using this vacuum film-forming apparatus and therefore, the reaction between a raw gas and a reactant gas can be accelerated to thus give a thin film having excellent quality. This further allows the reduction of the time required for the transfer of the substrate S and as a result, the cycle time required for carrying out the film-forming process can thus be reduced. Moreover, the apparatus can thus be manufactured at a low cost.

Then the thin film-forming method, which makes use of the vacuum film-forming apparatuses 101 and 301 as shown in FIGS. 1 and 3 to 5, respectively, will be detailed below while taking the method for preparing a barrier film by way of example.

In forming a thin film using the foregoing vacuum film-forming apparatus according to the ALD technique, the method comprises the steps of placing a substrate, on which a desired film is deposited, on a substrate stage or a turn table; then introducing a desired raw gas into the space within a vacuum chamber formed between the substrate stage or the turn table and a vacuum chamber-forming container to thus adsorb the raw gas on the surface of the substrate; transferring the substrate carrying the raw gas adsorbed thereon to the space within another vacuum chamber; and then introducing a reactant gas into the space of the another vacuum chamber to induce the reaction of the adsorbed raw gas with the reactant gas and to thus form a thin film on the substrate. The method having such a construction would permit the independent establishment of the process conditions for these adsorption and reaction steps, the acceleration of the reaction between the raw gas and the reactant gas and the formation of a thin film having more excellent film quality. Moreover, the method likewise permits the considerable reduction of the cycle time of the film-forming process and also permits the formation of a thin film according to a low temperature process.

More particularly, in forming a thin film using the foregoing vacuum film-forming apparatus according to the ALD technique, a method comprises the steps of arranging a substrate, on which a desired film is deposited and on which holes and/or trenches are formed, within the space of a vacuum chamber provided with a raw gas-introduction means; introducing a raw gas into the space under a predetermined pressure to thus adsorb the gas onto the surface of the substrate; transferring the substrate carrying the raw gas adsorbed thereon to the space of a vacuum chamber provided with a reactant gas-introduction means; and then introducing an excited reactant gas into the space to induce the reaction between the adsorbed raw gas and the excited reactant gas and to thus form a thin film on the substrate including the inner walls of the holes and/or trenches. The method having such a construction would permit the independent establishment of the process conditions for these adsorption and reaction steps, the acceleration of the reaction between the raw gas and the reactant gas and the formation of a thin film having more excellent film quality. Moreover, the method likewise permits the considerable reduction of the cycle time of the film-forming process and also permits the formation of a thin film even on the inner walls of the holes and/or trenches in good coverage according to a low temperature process, without being accompanied by any overhanging phenomenon at the upper portions of, for instance, these fine holes and/or trenches.

In the thin film-forming method carried out using the vacuum film-forming apparatus 101 as shown in FIG. 1, the vacuum film-forming apparatus is first operated to evacuate the interiors of the road-lock chamber 111 and the vacuum film-forming apparatus 101, a substrate S to be deposited with a desired film is conveyed from the road-lock chamber 111 to the interior of the vacuum film-forming apparatus 101 and then placed on the substrate stage 102a. At this stage, the heating means built in each substrate stage 102a (102b) is also operated.

When the pressure in the vacuum film-forming apparatus 101 reaches a desired value (the order of, for instance, $2 \times 10^{-5}$ Torr) due to the evacuation, the substrate stage 102a is ascended such that the substrate stage and the bell-jar shaped container 104a can form a space 105a (or a vacuum chamber) and that the substrate S is positioned within the space (see FIG. 1(b)). At this stage, it is preferred that the substrate stage 102b is simultaneously ascended such that the atmosphere within the space 105b thus formed is isolated from that within the space 105a. In this case, the bell-jar-shaped container may be descended so that the container and the substrate stage may form a space or the substrate stage and the bell-jar-shaped container may relatively be ascended or descended to thus form a desired space or a vacuum chamber. The vacuum chambers as will be described below can be formed according to the same manner.

In the state in which the substrate S to be deposited with a film is placed in the position as shown in FIG. 1(b), the temperature of the substrate S on the substrate stage 102a is maintained at a predetermined level (at a temperature ranging from 50 to 450° C. and preferably 80 to 300° C., for instance, 150° C.) by using a heating means, while a raw gas such as $Zr(BH_4)_4$ gas (0.5 to 200 sccm) is introduced into the vacuum chamber through the gas-introduction means 107a in such a manner that the pressure within the space 105a formed in the vacuum chamber is maintained at a desired level (on the order of, for instance, $3\times10^{-1}$ Torr) and then the foregoing conditions are maintained for a predetermined period of time (0.1 to 10 seconds, for instance, 2 seconds) to thus adsorb the raw gas onto the substrate S.

If the temperature of the substrate S is less than 50° C., it takes a very long time for the completion of the desired process, while if it exceeds 450° C., any barrier layer (a layer of, for instance, a $ZrB_2$ film or a ZrBN film) cannot be used for a distributing wire layer for a semiconductor device which makes use of Cu and/or Al. In the adsorption step, if the raw gas-supply time is less than 0.1 second, a desired amount of the raw gas is not adsorbed on the substrate, while the use of a raw gas-supply time of longer than 10 seconds is not reasonable since it is too long from the viewpoint of the throughput. Further, if the flow rate of the raw gas supplied is less than 0.5 sccm, any desired effect of adsorption cannot be expected, while the use of a flow rate of the raw gas on the order of greater than 200 sccm is not reasonable since it takes a long period of time for the exhaust treatment after the completion of the adsorption step.

After the completion of the adsorption step, the excess raw gas is evacuated out of the apparatus through the gap 106a and the exhaust path V (or the exhaust means 113). Then the substrate stages 102a and 102b are descended to thus open every vacuum chambers and the substrate-conveying means 110 is operated to transfer the substrate S from the substrate stage 102a to the substrate stage 102b. Then a predetermined or desired pressure (for instance, $2\times10^{-5}$ Torr) is again established in the vacuum film-forming apparatus 101 including the interiors of the bell-jar-shaped vacuum containers 104a and 104b by the evacuation, the substrate stage 102b is ascended so that the substrate stage and the bell-jar-shaped container 104b form a space 105b and that the substrate S is positioned within the space (see FIG. 1(b)). At this stage, it is preferred that the substrate stage 102a is simultaneously ascended such that the atmosphere within the space 105a thus formed is isolated from that within the space 105b.

In the state in which the substrate S to be deposited with a film is placed in the foregoing position, the temperature of the substrate S on the substrate stage 102b is maintained at a predetermined level (at a temperature of, for instance, 450° C.) by the heating means, while a reactant gas (20 to 1000 sccm) such as excited $NH_3$ and/or $H_2$ gas is introduced into the vacuum chamber through the gas-introduction means 107b in such a manner that the pressure within the space 105b formed in the vacuum chamber is maintained at a desired level (on the order of, for instance, $5\times10^{-1}$ Torr) and the reactant gas is allowed to thus react with the raw gas adsorbed on the substrate S for a predetermined period of time (for instance, 0.1 to 10 seconds) to thus form a desired barrier film (a layer of, for instance, a $ZrB_2$ film or a ZrBN film) on the substrate S. In this case, the reactant gas introduced is preferably excited and converted into radicals by the action of a catalytic means.

In the reaction step or the step for the decomposition of the raw gas, if the supply time of the excited reactant gas is less than 0.1 second, the reaction between them cannot be ensured, while the use of the supply time of longer than 10 seconds is too long and is not reasonable from the viewpoint of the throughput. Further, if the flow rate of the reactant gas supplied is less than 20 sccm, any desired reaction effect cannot be expected, while the use of a flow rate of the reactant gas supplied on the order of greater than 1000 sccm is not reasonable since it takes a long period of time for the exhaust treatment after the completion of the reaction step.

After the completion of the foregoing reaction step, the gases as by-products as well as the unreacted or unchanged gases are externally evacuated out of the apparatus through the gap 106b and the exhaust path V (or the exhaust means 113). Then the substrate stages 102a and 102b are brought down to thus open every vacuum chambers and the substrate S is again transported to the substrate stage 102a for the adsorption step by the operation of the substrate-conveying means 110. Then a series of film-forming operations comprising the adsorption and reaction steps is repeated over a desired times according to the foregoing procedures to thus form a thin film (a $ZrB_2$ film or a ZrBN film) having a desired thickness. As a result, it has been confirmed that the resulting thin film is completely free of the formation of any overhang on, for instance, holes and/or trenches and that the film is likewise formed even on the inner wall of these holes and trenches in a good coverage.

As has been discussed above in detail, the spaces 105a and 105b are exhausted, during the film-forming process, through the gaps 106a and 106b each formed during the film-forming process in such a manner that it surrounds the periphery of the corresponding substrate stage. This is because, if the gases present in these spaces are directly discharged into the vacuum film-forming apparatus 101 through the gap, the raw gas and the reactant gas are admixed together in the vacuum film-forming apparatus when the foregoing adsorption and reaction steps are simultaneously carried out and particles are thus formed through the gas-phase reaction of these components. It is preferred for the prevention of the formation of any particle that the apparatus is provided with an exhaust path V, whereby the bell-jar-shaped containers 104a and 104b are capped with the exhaust means 113 provided with such an exhaust path V (see FIGS. 1(b) and 1(c)) when practicing these adsorption and reaction steps. If the exhaust means 113 is secured to each substrate stage 102a, 102b through fixing members 114 as shown in FIG. 1(c), at least part of the exhaust means can be formed of a piping work 115 such as a bellows type one, whereby the exhaust means can in turn be moved in response to the upward and downward movement of the substrate stages 102a and 102b. The exhaust means or the exhaust paths may be so designed that they can be combined into one as shown in the attached figure to thus externally discharge gases out of the vacuum film-forming apparatus 101. Alternatively, each vacuum container is provided with a separate exhaust means so that the exhaust gas may separately, externally be discharged from the apparatus.

When it is intended to supply the foregoing excited reactant gas onto the substrate S to be deposited with a film, it is sufficient that the gas piping work 108b is connected to the gas-introduction means 107b through a catalyst chamber 202 (FIG. 2) comprising a catalytic means such as a known catalyst wire of, for instance, tungsten and that the reactant gas, which passes through the catalyst chamber and which is thus excited, is supplied onto the surface of the substrate S through the gas-introduction means equipped with a shower plate or a dispersion plate. Alternatively, the foregoing catalytic means may be arranged within the space 105b or at the upstream side of the shower plate or the dispersion plate of the gas-introduction means 107b and the reactant gas may thus be excited through the catalytic means before the supply of the reactant gas to the substrate S through the shower plate or the dispersion plate equipped with a cooling mechanism. In this respect, the temperature of the catalyst wire during the film-forming process is preferably changed from that observed for the same in the waiting or standby state by controlling the electric current or electric voltage applied to the wire.

The temperature control of the tungsten wire can be, for instance, carried out as follows: When the reactant gas is excited by heating the tungsten wire to a temperature of about 1700° C. by the application of an electric current to the wire, the intensity of the electric current may variously vary depending on the pressure around the wire or flow rate of the gas passing through the wire and a constant-current circuit use, but it in general sets at a level of about 12 A for a wire of 0.5 mm (diameter). If such an electric current is continuously applied to the wire, the temperature of the wire increases and this in turn leads to an increase of the temperature of, for instance, the wafer or the substrate stage. Accordingly, the temperature thereof should be controlled by changing the temperature of the catalyst wire from the film-forming step to the waiting or standby stage. When the gas pressure near the tungsten wire is, for instance, 100 Pa, an electric current of 12 A is applied to the wire to thus heat the same to a temperature of about 1700° C. during the film-forming process to thus excite the reactant gas, while the temperature of the wire during the standby state is maintained at a lower level. In this respect, for instance, the temperature of the wire is found to be 500° C. when a current of 5 A is applied thereto and 190° C. when a current of 3 A is applied. Thus, the intensity of the electric current to be applied to the wire can be adjusted in response to the temperature of the substrate stage.

Figure 2:
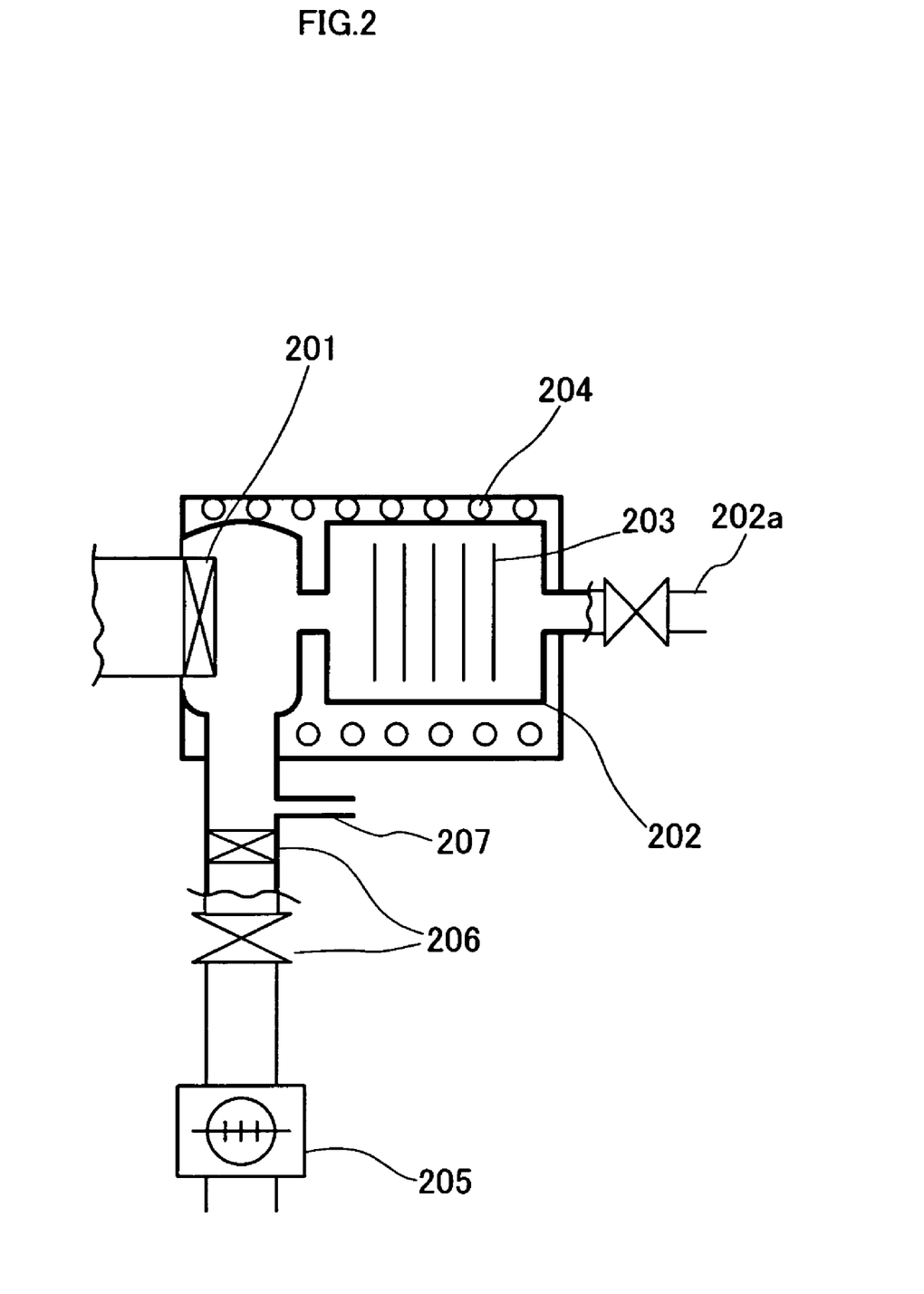
FIG. 2 is a schematic diagram for illustrating an example of the catalytic means used in the present invention.

According to the foregoing thin film-forming method, as will be clear from FIG. 2, $H_2$ gas and/or $NH_3$ gas as reactant gases are introduced into the catalyst chamber 202 through the gas-introduction port 202a, the reactant gases are thus excited in the catalyst chamber in which the reactant gases are brought into close contact with the catalyst heated to a temperature generally ranging from 1600 to 1900° C. and preferably 1700 to 1800° C., the reactant gases thus excited are then introduced into the vacuum chamber at a flow rate ranging from 20 to 1000 sccm for a time ranging from 0.1 to 10 seconds by opening the valve 201 so that the reactant gases undergo the reaction with the raw gas adsorbed on the substrate S (the reaction step). In this connection, if the catalyst temperature is less than 1600° C., the catalyst wire of, for instance, tungsten can never show its catalytic effect sufficiently and $H_2$ gas and/or $NH_3$ gas are converted into their radicals in only a low efficiency, while if the temperature exceeds 1900° C., the catalyst wire of, for instance, tungsten per se undergoes sublimation due to the heat thus generated and this in turn leads to the breakage of the catalyst wire and/or the tungsten atoms thus sublimated may serve as contaminants and thus adversely affect the quality of the resulting thin film. In this connection, the apparatus is so designed that the pressure in the catalyst chamber 202 does not cause any change even when opening or closing a valve 201 such as an isolation valve dividing the catalyst chamber 202 from the vacuum chamber because of the presence of a vent line 207 positioned between the catalyst chamber 202 and the valve 206 which is arranged between the catalyst chamber 202 and the exhaust means 205.

As discussed above, there has been described an example of the method for the preparation of a thin film, in which only one substrate S is cyclically transported between the substrate stages 102a and 102b and the adsorption and reaction steps are repeated, over a desired times to thus form a desired thin film. In this respect, the adsorption and reaction steps are separately carried out in the spaces of the predetermined vacuum chambers. However, it is also possible to form such a desired thin film as follows: For instance, two arms are fixed to the shaft part 110a to thus simultaneously transfer two substrates S to be deposited with thin films between the substrate stages 102a and 102b so that a series of operations can simultaneously be carried out. More specifically, one of these two substrates is subjected to an adsorption treatment, while the other is subjected to a reaction treatment. In this connection, at least three of substrates S may simultaneously be processed or subjected to adsorption and/or reaction steps while increasing the numbers of arms and vacuum chambers to be used.

Moreover, in the thin film-forming method which makes use of the vacuum film-forming apparatus 301 as shown in FIGS. 3 to 5, the road-lock chamber 314 and the vacuum film-forming apparatus are first evacuated by operating the vacuum exhaust means, the first substrate S is then transferred to the vacuum film-forming apparatus through the road-lock chamber 314 so that the substrate S is placed on a substrate-supporting part 309a disposed on the turn table 308 (see FIG. 5(a)). At this stage, the heating means built in each substrate stage 302a to 302d is operated.

A desired pressure (for instance, $2 \times 10^{-5}$ Torr) is established within the vacuum film-forming apparatus 301 by the foregoing evacuation and the upper face of the turn table 308 is then brought into contact with the opening of each corresponding bell-jar-shaped container 306a to 306d by ascending the turn table 308 by the action of a driving shaft 308-2 due to the operation of a driving means 308-1 to thus form each desired vacuum chambers having each spaces 307a to 307d. In this respect, the turn table is ascended till the substrate-supporting part 309a provided thereon with the substrate S is projected into the bell-jar-shaped container 306a to thus realize a state in which the substrate S is positioned within the first space 307a thus formed (see FIG. 5(b)). At this stage, all of the openings of the bell-jar-shaped containers are covered with the turn table 308 so that the atmospheres in the spaces 307a to 307d are isolated from one another.

Then, when the driving means 303a to 303d are operated, the stage-supporting table 305 is elevated by the action of the driving shafts 304a to 304d till the substrate stages 304a to 304d are projected through the corresponding through holes 308a to 308d, respectively. Thus the upper face of the substrate stage is pressed against the lower face of the substrate S and the upper face of the stage-supporting table is brought into contact with the lower face of the turn table by further ascending the stage-supporting table so that the substrate S placed on the substrate stage 302a is in the film-forming position within the first space 307a (see FIG. 5(c)).

Thereafter, in the state as shown in FIG. 5(c), the first substrate S on the substrate stage 302a is heated to and maintained at a desired temperature (ranging from 50 to 450° C., preferably 80 to 300° C., for instance, 300° C.) by a heating means, then a raw gas such as $Zr(BH_4)_4$ gas is introduced, through the gas-introduction means 311a, into the space 307a within the vacuum chamber formed by the turn table 308 and the bell-jar-shaped container 306a at a flow rate ranging from 0.5 to 200 sccm so that a desired gas pressure (for instance, $3 \times 10^{-1}$ Torr) is established within the space and thereafter these conditions are maintained for a predetermined period of time (for instance, 0.1 to 10 seconds, for instance, 2 seconds) to thus adsorb the raw gas on the surface of the first substrate S. In this case, the gases are discharged out of the apparatus through the exhaust port 305a of the stage-supporting table 305 which communicates with the exhaust hole 308e and the exhaust path formed within the stage-supporting table and accordingly, the pressure within the space 307a can be maintained at a predetermined level. In addition, after the completion of the adsorption step, the excess raw gas is likewise exhausted out of the apparatus through the evacuation.

After the completion of the foregoing adsorption step, the stage-supporting table 305 is descended and the turn table 308 is likewise descended to open each vacuum chamber and to thus return the apparatus to the state as shown in FIG. 5(a). Thereafter the turn table 308 is rotated by a desired angle (in this embodiment, 90 deg.) so that the positions of the substrate stages 302a to 302d are in good agreement with those of the through holes 308a to 308d, respectively. In this case, the first substrate S, on which the raw gas has been adsorbed, is transported to the position just above the second substrate stage 302b and placed on the substrate-supporting part 309b, while the second substrate S is conveyed through the road-lock chamber 314 and placed on the substrate-supporting part 309a of the vacant substrate stage 302a previously occupied by the first substrate S.

Then the vacuum film-forming apparatus 301 is evacuated till the pressure of the interior thereof reaches the predetermined level specified above, the turn table 308 is elevated so that the upper face of the turn table comes in contact with the opening of each bell-jar-shaped container 306a to 306d to thus form each corresponding space 307a to 307d. More specifically, the turn table 308 is elevated till the substrate-support parts 309b and 309a, on which the first and second substrates S are placed respectively, are projected into the bell-jar-shaped containers 306b and 306a, respectively so that each of the substrates S is placed at the desired position in the second space 307b or the first space 307a thus formed (see FIG. 5(b)). At this stage, all of the openings of the bell-jar-shaped containers are covered with the turn table 308 so that the atmospheres in the spaces 307a to 307d are isolated from one another.

Then, when the driving means 303a to 303d are operated, the stage-supporting table 305 is elevated by the action of the driving shafts 304a to 304d till each substrate stage is projected through the corresponding through hole 308a to 308d of the turn table. Thus the upper face of the substrate stage is pressed against the lower face of each substrate S and the upper face of the stage-supporting table is brought into contact with the lower face of the turn table by further ascending the stage-supporting table so that the first and second substrates S placed on the substrate stages 302b and 302a respectively occupy the corresponding film-forming positions within the respective second and first spaces 307b and 307a.

At this stage in which the substrates to be deposited with films are in the respective film-forming positions, the first substrate S, which is placed on the substrate stage 302b and which carries the raw gas adsorbed on the surface thereof, is heated to and maintained at a desired temperature (for instance, 500° C.) and a gas obtained by exciting a reactant gas such as $NH_3$ gas and/or $H_2$ gas through the ionization or by converting the same into radicals (in a flow rate of, for instance, 20 to 1000 sccm) is introduced into the space 307b within the second vacuum chamber formed by the turn table 308 and the bell-jar-shaped container 306b through the gas introduction means 311b till the pressure within the space 307b reaches a desired level (for instance, $5 \times 10^{-1}$ Torr), followed by the reaction of the excited reactant gas with the raw gas adsorbed on the substrate S while allowing the system to stand for a predetermined period of time (in the order of 0.1 to 10 seconds, for instance, 2 seconds) to thus form a thin film of, for instance, $ZrB_2$ or ZrBN on the first substrate S.

Simultaneously, the second substrate S placed on the substrate stage 302a is heated to and maintained at a desired temperature specified above (for instance, 300° C.) and then a raw gas is introduced into the space 307a within the first vacuum chamber formed by the turn table 308 and the bell-jar-shaped container 306a through the gas-introduction means 311a till the pressure in the space 307a reaches a predetermined level (for instance, $3 \times 10^{-1}$ Torr), followed by allowing the system to stand for a predetermined period of time specified above (for instance, 2 seconds) so that the raw gas is adsorbed on the surface of the second substrate S.

After the completion of the reaction step for the first substrate S and the adsorption step for the second substrate S, the excess raw gas, unreacted or unchanged reactant gas, by-product gases or the like are exhausted out of the apparatus through the exhaust holes 308e, 308f, the exhaust port 305a formed on the upper face of the stage-supporting table 305 and the exhaust path formed within the stage-supporting table, through evacuation. Then the stage-supporting table 305 is brought down and the turn table 308 is likewise descended so that every vacuum chambers are opened. Thereafter the turn table 308 is further rotated by a desired angle (in this embodiment, 90 deg.) so that the positions of the substrate stages 302a to 302d are in good agreement with those of the through holes 308a to 308d, respectively. In this case, the first substrate S is transported to the position just above the third substrate stage 302c while the second substrate S is transported to the position just above the second substrate stage 302b and these substrates S are thus placed on the substrate-supporting parts. Moreover, the third substrate S is transferred through the road-lock chamber 314 and put on the vacant substrate-supporting part of the substrate stage 302a, which has previously been occupied by the second substrate S.

Then the adsorption steps are carried out for the first and third substrates S and the reaction step is carried out for the second substrate S according to the same procedures used above. After the completion of these steps, the excess raw gas, the unchanged reactant gas, the by-product gases or the like are externally exhausted out of the film-forming apparatus through the same procedures for the evacuation used above. Thereafter, the stage-supporting table 305 is descended and the turn table 308 is also descended to open each vacuum chamber. Then the turn table 308 is further rotated by a desired angle (in this embodiment, 90 deg.) so that the positions of the substrate stages 302a to 302d are in good agreement with those of the through holes 308a to 308d, respectively. In this case, the first substrate S is transported to the position just above the fourth substrate stage 302d, the second substrate S is transported to the position just above the third substrate stage 302c and the third substrate S is transported to the position just above the second substrate stage 302b. More specifically, these substrates S are thus placed on the corresponding substrate-supporting parts. Moreover, the fourth substrate S is transferred through the road-lock chamber 314 and put on the vacant substrate-supporting part 309a of the substrate stage 302a, which has previously been occupied by the third substrate S. Then the adsorption steps are carried out for the second and fourth substrates S, while the reaction steps are carried out for the first and third substrates S according to the same procedures used above.

Thereafter, in the apparatus in which these four substrates S are put on the corresponding substrate-supporting parts, the adsorption and reaction steps are repeated over desired times generally ranging from several times to several hundred times, while rotating the turn table by a desired angle at a time to thus form a thin film (for instance, a ZrBN film or a ZrB$_2$ film) having a desired thickness on each substrate S. In this connection, it has been confirmed that the resulting thin film is completely free of any overhang on the upper portion of, for instance, holes and/or trenches and it is formed even on the inner face of these holes and trenches in a good coverage.

As has already been described in connection with FIG. 1, when a reactant gas is first excited and then supplied onto the substrate S to be deposited with a film as has been discussed above, it is sufficient that the gas piping work is connected to the gas-introduction means through a catalyst chamber 202 (FIG. 2) comprising a catalytic means such as a known catalyst wire of, for instance, tungsten and then the excited reactant gas is supplied onto the surface of the substrate S through the gas-introduction means equipped with a shower plate or a dispersion plate. Alternatively, the foregoing catalytic means may be arranged within the space or at the upstream side of the shower plate or the dispersion plate of the gas-introduction means and the reactant gas may thus be excited through the catalytic means before the supply of the reactant gas to the substrate S through the shower plate or the dispersion plate equipped with a cooling mechanism. In this respect, the temperature of the catalyst wire such as a tungsten wire can be controlled by the method already described above.

Regarding the vacuum film-forming apparatus 301 provided with a turn table and shown in FIGS. 3 to 5, each of the adsorption and reaction steps is conducted only once during the term elapsed after the substrate to be deposited with a film is transferred to the interior of the vacuum chamber and till the next substrate to be deposited with a film is introduced into a desired vacuum chamber, for making the explanation simple. However, it is preferred to carry out each of these steps several times during the spare time before the next substrate is introduced into a desired vacuum chamber. For instance, in the case of a so-called integration apparatus or the vacuum film-forming apparatus according to the present invention which permits the practice of not only the process for forming a thin film such as a barrier film, but also the processes prior to and subsequent to the thin film-forming process, a considerable time may be required for the transportation of a substrate to be deposited with a film into the film-forming apparatus. Therefore, it would be quite efficient that the turn table is rotated during this spare time and the adsorption and reaction steps may be repeated several times for the substrates which have already accommodated in the vacuum chambers to improve the throughput and to thus make the best use of the spare time.

In this respect, in forming a thin film using the foregoing thin film-forming apparatus according to the present invention, if a raw gas (or a reactant gas) remains within each vacuum chamber or the film-forming apparatus in a high concentration, a problem arises, such that the remaining gas may cause a gas-phase reaction with the reactant gas (or the raw gas) to form particles and to thus cause deposition of such particles on the inner walls of, for instance, the vacuum chamber and/or the film-forming apparatus. For this reason, it is preferred to evacuate the vacuum chamber to a pressure as low as possible or to introduce an inert gas (such as N$_2$ or Ar gas) into the same to thus reduce the remaining gas concentration as low as possible.

According to the foregoing thin film-forming method, for instance, an insulating film such as a P—SiO film, a BPSG film or an HDP-PSG film, a P—SiOC film, or a low dielectric film such as a porous Low-k film is formed on a substrate by the sputtering technique, the CVD technique or a coating method, the resulting insulating or low dielectric film is etched under the usual etching conditions to thus form, for instance, fine holes and/or trenches each having a high aspect ratio and the resulting product can be used as a substrate to be deposited with a thin film for forming a thin film such as a barrier film according to the ALD technique as has been described above in detail. In this respect, the thin film such as a barrier film can be formed on the substrate without causing the formation of any overhang on the upper portions of, for instance, the holes and the thin film of high quality can likewise be formed on the inner walls of the holes or the like in a high coverage. As the foregoing substrate, there may be listed, for instance, substrates currently used in the semiconductor devices such as Si substrates.

As has been discussed above in detail, the thin film-forming method would permit the formation of a thin film consisting of, for instance, ZrB$_2$ film or a ZrBN film on a substrate to be deposited with a thin film including the inner walls of holes and/or trenches thereof using a raw gas such as Zr(BH$_4$)$_4$ gas and a reactant gas such as at least one of excited H$_2$ gas and NH$_3$ gas.

Regarding the raw gas, the material for the raw gas undergoes thermal decomposition when the temperature thereof exceeds 60° C. and therefore, the material is first gasified at a temperature of not more than 60° C. and the resulting raw gas is then transported to a desired vacuum chamber. The raw gas thus generated, for instance, using a unit as shown in FIGS. 6(*a*) to (*c*) is introduced into a vacuum chamber at a flow rate ranging from 0.5 to 200 sccm for a time ranging from 0.1 to 10 seconds.

More specifically, a net 602 having a very small mesh size is disposed within a tank 601 heated to and maintained at a temperature of less than the melting point (28.7° C.) of Zr(BH$_4$)$_4$ as a raw material such as 25° C. (vapor pressure: 16 mmHg), the granular raw material 603 is placed on the net, an inert gas such as Ar or N$_2$ as a bubbling gas is fed to the lower portion of the tank 601 through a mass flow controller 604 to thus make the inert gas flow through the raw material from the lower portion to the upper portion of the net 602, the raw material is thus sublimed by the action of this bubbling, the raw gas thus obtained is introduced into a vacuum chamber together with the bubbling gas (see FIG. 6(*a*)) to thus adsorb the raw gas onto the surface of a substrate on which a film is to be deposited.

Figure 6:
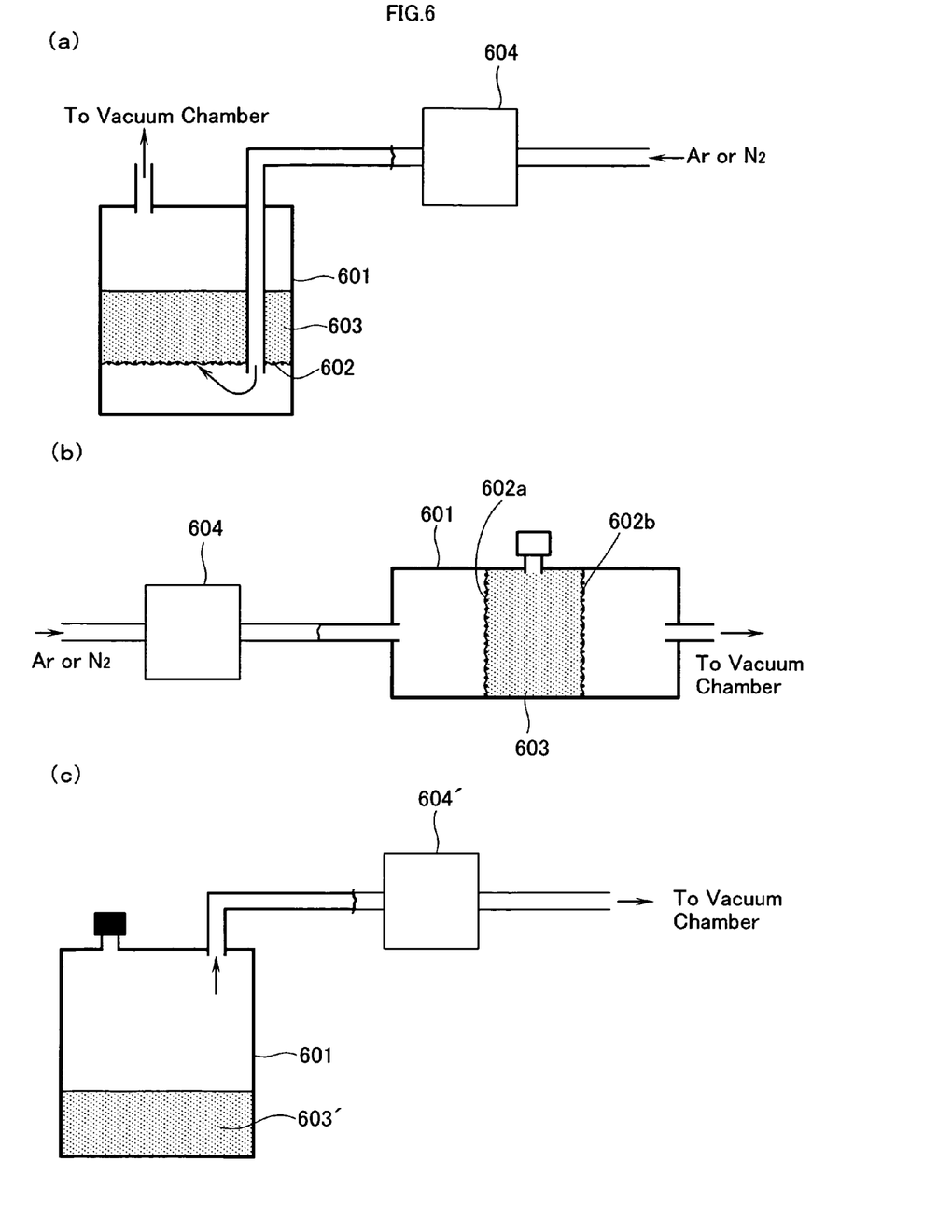
FIG. 6 is a schematic block diagram for illustrating the method for generating a raw gas when using the vacuum film-forming apparatus according to the present invention, wherein (a) is a diagram for explaining an example of the means for generating the raw gas; (b) is a diagram for explaining an example of another means for generating the raw gas; and (c) is a diagram for explaining an example of still another means for generating the raw gas.

Alternatively, granular raw material 603 is sandwiched between two nets 602*a* and 602*b* disposed within and secured to a tank 601 heated to and maintained at a temperature of less than the melting point (28.7° C.) of Zr(BH$_4$)$_4$ as a raw material such as 25° C., an inert gas such as Ar or N$_2$ as a bubbling gas is fed within the tank 601 through a mass flow controller 604 to thus make the inert gas flow through the raw material from the net 602*a* to the net 602*b*, and the raw material 603 is thus sublimed by the action of this bubbling, the raw gas thus generated is introduced into a vacuum chamber together with the bubbling gas (see FIG. 6(*b*)) to thus adsorb the raw gas onto the surface of a substrate to be deposited with a film.

Further, the raw gas may likewise be introduced into a desired vacuum chamber according to the following method: a raw material 603' is introduced into a tank 601 heated to and maintained at a temperature of not less than the melting point of Zr(BH$_4$)$_4$ as a raw material, for instance, about 50° C. (vapor pressure: 55 mmHg), the raw gas thus gasified is introduced into a desired vacuum chamber while directly controlling the gas using a mass flow controller 604' such as a low pressure-difference mass flow controller (see FIG. 6(*c*)) and after the introduction of the raw gas, it is adsorbed onto the surface of a substrate to be deposited with a film.

In the present invention, it would be desirable that prior to the foregoing adsorption step, the surface of the substrate S to be deposited with a film should be pre-treated by introducing, into the vacuum chamber, an excited reactant gas such as $H_2$ gas and/or $NH_3$ gas excited by a catalytic means, preferably hydrogen radicals generated by exciting $H_2$ gas or hydrogen ions and hydrogen radicals obtained by exciting preferably $H_2$ gas treated in a plasma generator to thus irradiate the substrate with such an excited gas. This allows the pre-treatment of the surface of a metal film and that of an insulating film formed on the substrate or wafer and this accordingly permits the substantial improvement in the adhesion between the thin film to be applied onto the substrate and the insulating film such as an $SiO_2$ film as a primary coat.

Incidentally, various apparatuses and tools, which have been used in the film-forming method, such as the film-forming apparatus, the vacuum chambers, the catalytic means and the piping works can be cleaned, for instance, by the introduction of a cleaning gas such as $NF_3$ into these machinery and tools, while establishing desired conditions within the same.

The vacuum film-forming apparatus of the present invention permits the independent establishment of process conditions required for the adsorption and reaction processes and the better acceleration of the reaction between a raw gas and the reactant gas to thus give a thin film having excellent quality and the apparatus can be manufactured at a low cost.

Consequently, the present invention may effectively be used in the fields of electric and electronics such as the field of semiconductor. For instance, the present invention can be applied to the technical fields of the production of semiconductor integrated circuits, which include the process for forming a thin film such as a primary coat serving as a barrier film when filling fine contact holes, trenches and other similar structures up with a distributing wire material such as Cu and/or Al.

What is claimed is:

1. A vacuum film-forming apparatus comprising:
   a plurality of substrate stages for placing thereon a substrate and capable of freely moving up and down;
   a plurality of vacuum chamber-forming containers which are opposed to the plurality of substrate stages and which can freely move up and down;
   a conveying means for moving the substrate between the plurality of substrate stages;
   a plurality of gas-introduction means which are separately connected to every vacuum chamber-forming containers;
   means for moving the respective substrate stages and vacuum chamber-forming containers; and
   a plurality of exhaust means secured to each respective substrate stage by fixing members, the exhaust means being placed outside each substrate stage, wherein
   when practicing a film-forming process, at least one of each pair comprising the substrate stage and the vacuum chamber-forming container is moved toward each other to thus bring each exhaust means and an opening of the vacuum chamber-forming container into contact with one another so that a plurality of vacuum chambers can be formed,
   wherein an exhaust gap having a desired size is defined around the entire periphery of each substrate stage by an inner peripheral face of each vacuum chamber-forming container and an outer peripheral face of each substrate stage, when each exhaust means and the vacuum chamber-forming container are in contact with one another, and
   wherein each exhaust gap communicates with each exhaust means to form an exhaust path when each exhaust means and each vacuum chamber-forming container are in contact with one another.

2. The vacuum film-forming apparatus as set forth in claim 1, wherein the apparatus further comprises a plasma generator which is positioned on an exterior of at least one of the vacuum chamber-forming container.

3. The vacuum film-forming apparatus as set forth in claim 2, wherein the apparatus is further provided with a catalytic means which is connected to the vacuum chamber-forming container for carrying out the reaction step and placed on an exterior of the film-forming apparatus or within the vacuum chamber for carrying out the reaction step so that the reactant gas excited by the catalytic means can be introduced into a space for carrying out the reaction step.

4. The vacuum film-forming apparatus as set forth in claim 1, wherein the apparatus is further provided with a catalytic means which is connected to the vacuum chamber-forming container for carrying out the reaction step and placed on an exterior of the film-forming apparatus or within the vacuum chamber for carrying out the reaction step so that the reactant gas excited by the catalytic means can be introduced into a space for carrying out the reaction step.

5. The vacuum film-forming apparatus as set forth in claim 3, wherein the catalytic means and the vacuum chamber-forming container in which the reaction step is carried out are equipped with cooling means.

6. The vacuum film-forming apparatus as set forth in claim 1, wherein the vacuum chamber-forming container is one having a bell-jar shape.

7. The vacuum film-forming apparatus as set forth in claim 1, wherein each of the plurality of substrate stages is equipped with a heating means for heating the substrate.

8. The vacuum film-forming apparatus as set forth in claim 1, wherein each exhaust path is connected to a common exhaust passage.

9. The vacuum film-forming apparatus as set forth in claim 1, wherein each exhaust means comprises an expandable portion, the expandable portion expanding or contracting to move each exhaust means in accordance with the movement of each substrate stage.

* * * * *